US012412824B2

(12) United States Patent
Ko et al.

(10) Patent No.: US 12,412,824 B2
(45) Date of Patent: Sep. 9, 2025

(54) SEMICONDUCTOR PACKAGES AND METHODS OF FORMING THE SAME

(71) Applicant: SAMSUNG ELECTRONICS CO., LTD., Suwon-si (KR)

(72) Inventors: Yeongbeom Ko, Suwon-si (KR); Junyun Kweon, Suwon-si (KR); Wooju Kim, Suwon-si (KR); Heejae Nam, Suwon-si (KR); Haemin Park, Suwon-si (KR); Junggeun Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 428 days.

(21) Appl. No.: 18/154,261

(22) Filed: Jan. 13, 2023

(65) Prior Publication Data

US 2023/0420352 A1    Dec. 28, 2023

(30) Foreign Application Priority Data

Jun. 23, 2022  (KR) .................. 10-2022-0076929

(51) Int. Cl.
H01L 23/498     (2006.01)
H01L 21/48      (2006.01)
(Continued)

(52) U.S. Cl.
CPC .... H01L 23/49833 (2013.01); H01L 21/4853 (2013.01); H01L 21/4857 (2013.01); H01L 21/486 (2013.01); H01L 21/561 (2013.01); H01L 21/568 (2013.01); H01L 23/3135 (2013.01); H01L 23/49816 (2013.01); H01L 23/49822 (2013.01); H01L 23/49838 (2013.01);
(Continued)

(58) Field of Classification Search
CPC .......................... H01L 23/49833; H10B 80/00
See application file for complete search history.

(56) References Cited

U.S. PATENT DOCUMENTS 9,136,143 B2     9/2015  Yu et al.
2010/0090323 A1  4/2010  Shinoda et al.
(Continued)

FOREIGN PATENT DOCUMENTS

KR       20140050507 A       4/2014

Primary Examiner — Douglas M Menz
(74) Attorney, Agent, or Firm — Wolf, Greenfield & Sacks, P.C.

(57) ABSTRACT

A semiconductor package, comprising: a first redistribution structure including a first redistribution via; a first package that is on an upper surface of the first redistribution structure and comprises a first pad; a second redistribution structure that is on a lower surface of the first redistribution structure and comprises a second redistribution via; a second semiconductor chip that is between the first redistribution structure and the second redistribution structure and comprises a connection pad; and a vertical connection structure that is between the first redistribution structure and the second redistribution structure, wherein the vertical connection structure is electrically connected to the first redistribution via and the second redistribution via, the connection pad is electrically connected to the second redistribution via, and the first redistribution via is electrically connected to the first pad.

20 Claims, 14 Drawing Sheets

(51) Int. Cl.
  *H01L 21/56*    (2006.01)
  *H01L 23/00*    (2006.01)
  *H01L 23/31*    (2006.01)
  *H10B 80/00*    (2023.01)

(52) U.S. Cl.
  CPC .............. *H01L 24/16* (2013.01); *H01L 24/32* (2013.01); *H01L 24/73* (2013.01); *H01L 24/96* (2013.01); *H01L 24/97* (2013.01); *H10B 80/00* (2023.02); H01L 24/48 (2013.01); H01L 2224/16235 (2013.01); H01L 2224/32225 (2013.01); H01L 2224/48147 (2013.01); H01L 2224/48227 (2013.01); H01L 2224/73253 (2013.01); H01L 2224/95001 (2013.01); H01L 2224/96 (2013.01); H01L 2224/97 (2013.01); H01L 2924/182 (2013.01)

(56)    References Cited

U.S. PATENT DOCUMENTS

| | | |
|---|---|---|
| 2014/0021583 A1* | 1/2014 | Lo .................. H01L 23/5389 |
| | | 257/532 |
| 2014/0110856 A1 | 4/2014 | Lin |
| 2017/0229426 A1* | 8/2017 | Hung ............... H01L 25/0657 |
| 2019/0273030 A1* | 9/2019 | Lim .................. H01L 23/3675 |
| 2020/0273804 A1 | 8/2020 | Jeon et al. |
| 2021/0272906 A1 | 9/2021 | Kim et al. |
| 2022/0045010 A1 | 2/2022 | Shin et al. |
| 2022/0045038 A1 | 2/2022 | An et al. |
| 2022/0077064 A1 | 3/2022 | Choi et al. |

\* cited by examiner

I - I'

II-II'

SEMICONDUCTOR PACKAGES AND METHODS OF FORMING THE SAME

CROSS-REFERENCE TO RELATED APPLICATION

This application claims the priority and benefit of Korean Patent Application No. 10-2022-0076929, filed on Jun. 23, 2022, in the Korean Intellectual Property Office, the inventive concepts of which are incorporated by reference herein in their entireties.

BACKGROUND

1. Field

The present inventive concept relates to semiconductor packages and methods for forming the same.

2. Description of Related Art

According to the implementation of weight reductions and high performance in electronic devices, miniaturization and high performance are also required in the field of semiconductor packages. In order to realize miniaturization, weight reduction, high performance, high capacity, and high reliability of a semiconductor package, research and development of a semiconductor package having a structure in which semiconductor chips are stacked in multiple stages is continuously being conducted.

SUMMARY

An aspect of the present inventive concept is to provide a semiconductor package having improved mass productivity.

According to an aspect of the present inventive concept, a semiconductor package is provided, the semiconductor package including: a first redistribution structure including a first redistribution via; a first package that is on an upper surface of the first redistribution structure and comprises a package substrate including a first pad, a first semiconductor chip on the package substrate, and a first encapsulant on the first semiconductor chip; a second encapsulant on the first package; a second redistribution structure that is on a lower surface of the first redistribution structure and comprises a second redistribution via; a second semiconductor chip that is between the first redistribution structure and the second redistribution structure and comprises a connection pad; a vertical connection structure that is between the first redistribution structure and the second redistribution structure; and a third encapsulant on the second semiconductor chip and the vertical connection structure, wherein the vertical connection structure is electrically connected to the first redistribution via and the second redistribution via, the connection pad is electrically connected to the second redistribution via, the first redistribution via is electrically connected to the first pad, and an upper surface of the first encapsulant is exposed from the second encapsulant.

According to an aspect of the present inventive concept, a semiconductor package is provided, the semiconductor package including: a first package including a first semiconductor chip, a package substrate including a first pad electrically connected to the first semiconductor chip and on which the first semiconductor chip is mounted, and a first encapsulant on a portion of the first semiconductor chip; a second encapsulant on a portion of the first package; a first redistribution structure including a first redistribution via connected to the first pad, and disposed on a lower surface of the first package; a second semiconductor chip disposed on a lower surface of the first redistribution structure, the second semiconductor chip having an upper surface facing the first redistribution structure and a lower surface on which a connection pad is disposed; and a second redistribution structure including a second redistribution via electrically connected to the connection pad of the second semiconductor chip, and disposed on the lower surface of the second semiconductor chip, wherein the first and second redistribution vias have respective inclined side surfaces, and become narrower in width toward the first package.

According to an aspect of the present inventive concept, a method for manufacturing a semiconductor package is provided, the method including: providing a first package including a first semiconductor chip, a package substrate including a first pad electrically connected to the first semiconductor chip and on which the first semiconductor chip is mounted, and a first encapsulant on the first semiconductor chip, wherein a front surface of the first package comprises the first encapsulant and a rear surface of the first package is positioned opposite to the front surface; attaching the front surface of the first package to a carrier substrate; forming a second encapsulant on the first package; forming a first redistribution structure including a first redistribution via connected to the first pad on the first package and the second encapsulant; forming a vertical connection structure connected to the first redistribution via on the first redistribution structure; mounting a second semiconductor chip on the first redistribution structure, wherein the second semiconductor chip includes a connection pad on an upper surface of the second semiconductor chip; forming a third encapsulant on the vertical connection structure and the second semiconductor chip; forming a second redistribution structure on the third encapsulant, wherein the second redistribution structure includes a second redistribution via connected to the vertical connection structure and the connection pad; and forming a connection portion on the second redistribution structure.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
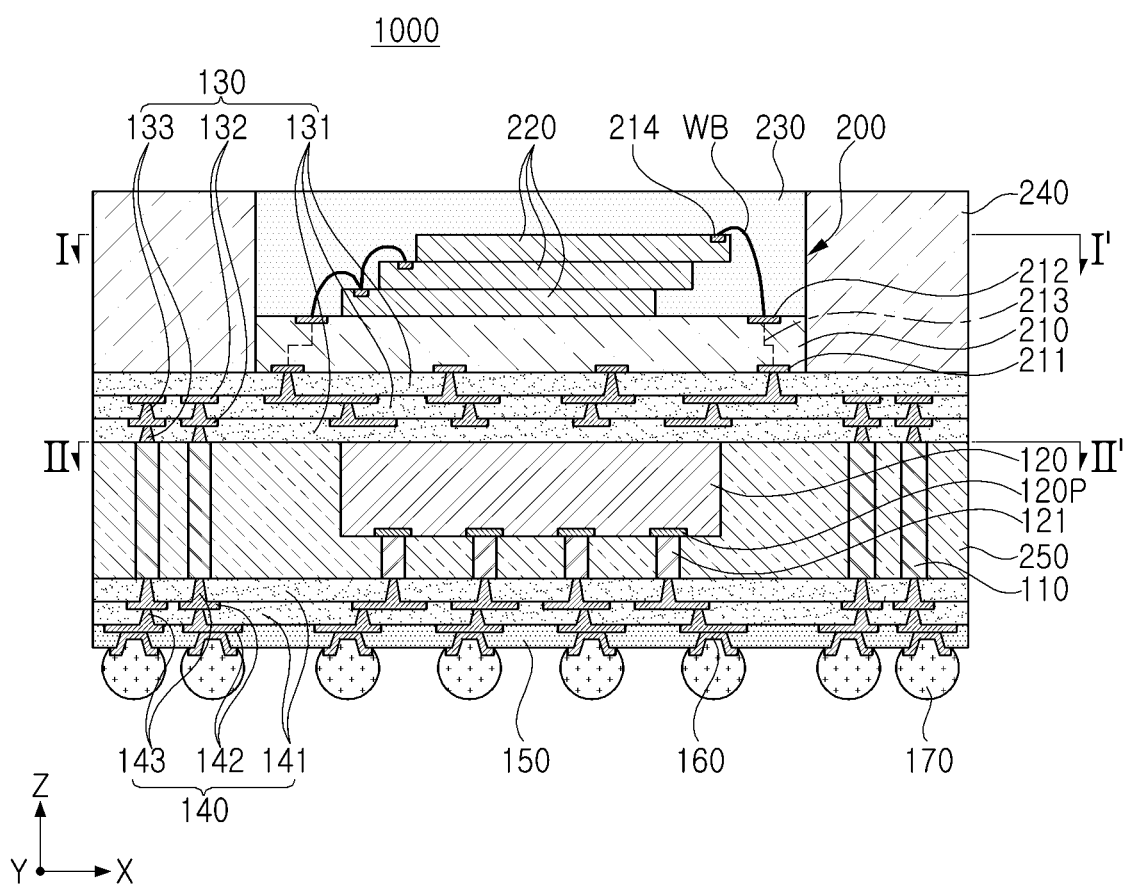
FIG. 1 is a cross-sectional view illustrating a semiconductor package according to an example embodiment of the present inventive concept.

Hereinafter, embodiments of the present inventive concept will be described with reference to the accompanying drawings. Hereinafter, terms such as 'an upper side, 'an upper portion', 'an upper surface', a lower side, a lower portion, a lower surface, and the like, may be understood as referring to the drawings, except where otherwise indicated by reference numerals.

Figure 2:
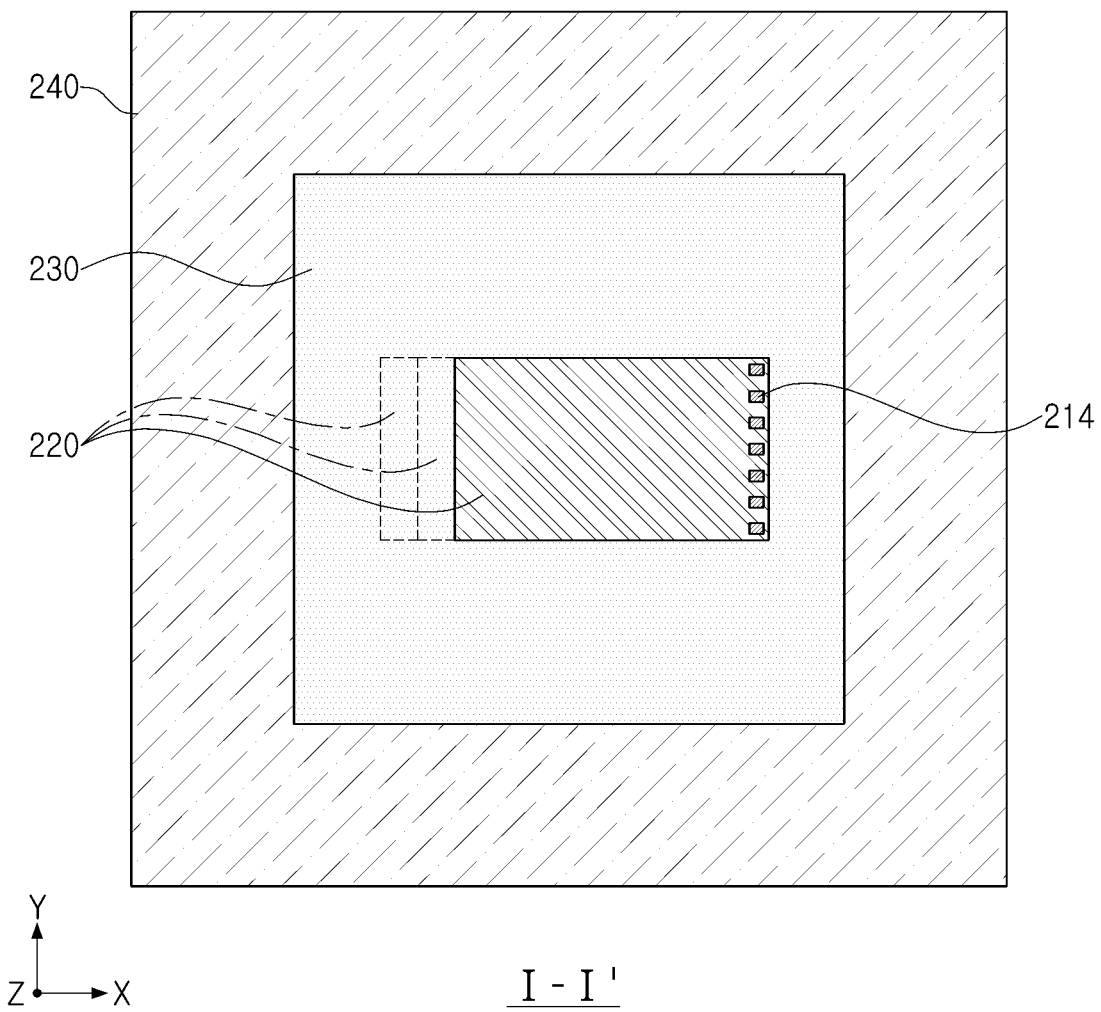
FIG. 2 is a plan view illustrating a cross-section taken along line I-I' of FIG. 1.
Figure 3:
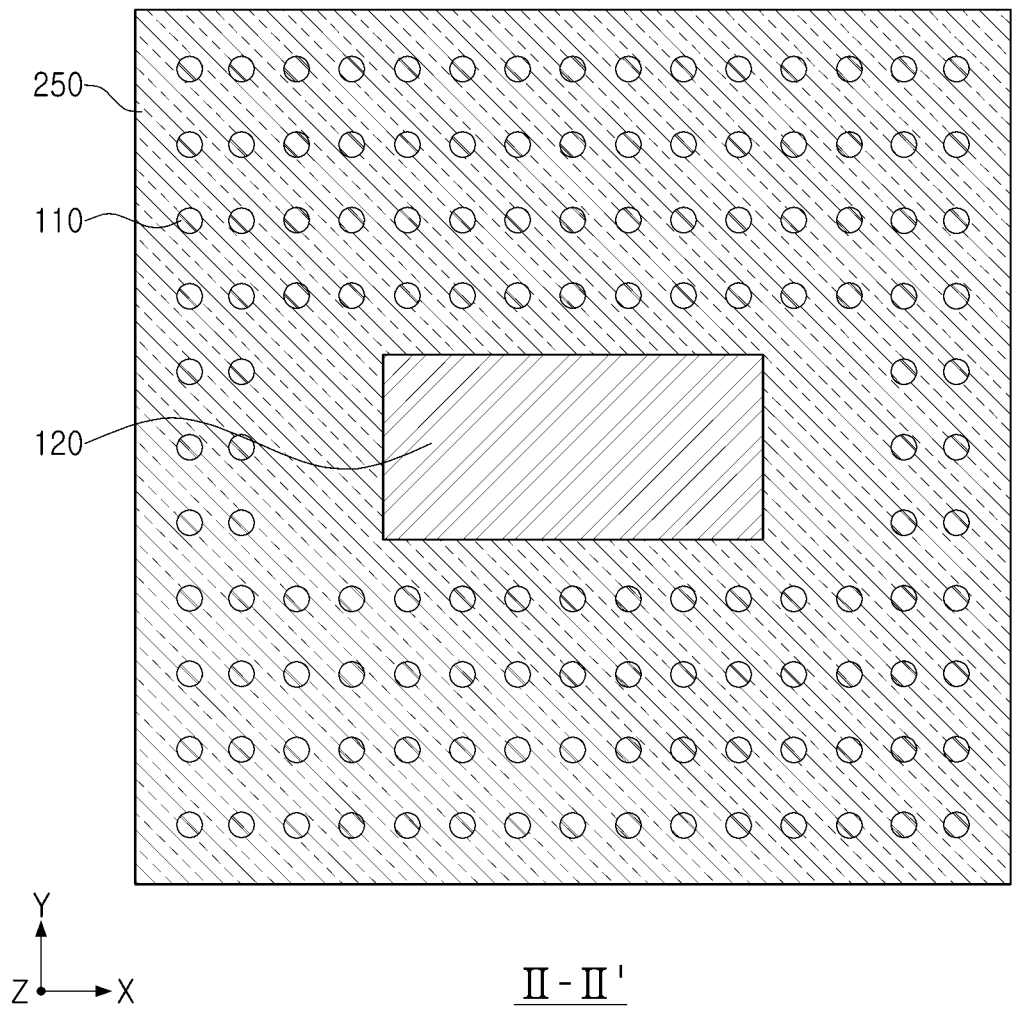
FIG. 3 is a plan view illustrating a cross-section taken along line II-II' of FIG. 1.

FIG. 1 is a cross-sectional view illustrating a semiconductor package 1000 according to an example embodiment of the present inventive concept, FIG. 2 is a plan view illustrating a cross-section taken along line I-I' of FIG. 1, and FIG. 3 is a plan view illustrating a cross-section taken along line II-I' of FIG. 1.

Referring to FIGS. 1 to 3, the semiconductor package 1000 according to the example embodiment of the present inventive concept may include a first package 200, a second encapsulant 240, a first redistribution structure 130, a second semiconductor chip 120, a vertical connection structure 110, a first connection portion 121, a second redistribution structure 140, a passivation layer 150, under bump metal 160, and a second connection portion 170.

The first package 200 may include a package substrate 210, a first semiconductor chip 220, and a first encapsulant 230. The package substrate 210 may include a first pad 211 and a second pad 212 that may be electrically connected to elements outside the package substrate 210. The first pad 211 and the second pad 212 may be respectively disposed on a lower surface and an upper surface of the package substrate 210. In addition, the package substrate 210 may include a redistribution circuit 213 electrically connecting the first pad 211 and the second pad 212 to each other. Furthermore, the first semiconductor chip 220 may further comprise a third pad 214 electrically connected to the second pad 212.

The first semiconductor chip 220 may be mounted on the package substrate 210 by a wire bonding method or a flip chip bonding method. For example, a plurality of first semiconductor chips 220 may be vertically stacked on the package substrate 210, and electrically connected to a second pad 212 of the package substrate 210 by a bonding wire WB. In one example, the first semiconductor chip 220 may include a memory chip, and the second semiconductor chip 120 may include an application processor (AP) chip, but an example embodiment is not limited thereto.

The first encapsulant 230 may encapsulate at least a portion of each of the first semiconductor chip 220 and the package substrate 210. The first encapsulant 230 may include, for example, a thermosetting resin such as an epoxy resin, a thermoplastic resin such as polyimide, or a prepreg including inorganic fillers and/or glass fibers, Ajinomoto Build-up Film (ABF), FR-4, Bismaleimide Triazine (BT), and EMC.

The first package 200 may be electrically connected to the second semiconductor chip 120 by first and second redistribution structures 130 and 140, a vertical connection structure 110, and a first connection portion 121. The first redistribution structure 130 may be electrically connected to the redistribution circuit 213 inside the package substrate 210 through the first pad 211 of the package substrate 210.

A lower surface of the first package 200 may be on (e.g., in contact with) an upper surface of the first redistribution structure 130.

The second encapsulant 240 may be on (e.g., encapsulate) a portion (e.g., side surface) of the first package 200. The second encapsulant 240 may include, for example, a thermosetting resin such as an epoxy resin, a thermoplastic resin such as polyimide, or a prepreg including inorganic fillers and/or glass fibers, ABF, FR-4, BT, and EMC. An upper surface of the second encapsulant 240 may be positioned on substantially the same level as an upper surface of the first package 200. A side surface of the second encapsulant 240 may be in contact with a side surface of the first encapsulant 230 and a side surface of the package substrate 210, and a lower surface of the second encapsulant 240 may be on (e.g., in contact with) an upper surface of the first redistribution structure 130.

The first redistribution structure 130 may include a first insulating layer 131, a first redistribution layer 132 disposed on the first insulating layer 131, and a first redistribution via 133 penetrating through the first insulating layer 131 to electrically connect the first redistribution layer 132 and the under bump metal 160 and/or the vertical connection structure 110. The first redistribution structure 130 may redistribute a connection pad 120P of the second semiconductor chip 120, and physically and/or electrically connect the connection pad 120P to the external devices or systems through a second connection portion 170. The number of the first insulating layers 131, the first redistribution layers 132, and the first redistribution vias 133 may be greater or fewer than those illustrated in the drawings. An upper surface of the first redistribution structure 130 may be on (e.g., in contact with) a lower surface of the first package 200 and the lower surface of the second encapsulant 240. In the semiconductor package 1000 of the present inventive concept, unlike a general interposer-package on package (I-POP) or an integrated fan out package on package (InFO), a separate substrate may not need to be disposed between the first package 200 and the first redistribution structure 130, and accordingly, a semiconductor package having a relatively thin thickness may be provided.

The first insulating layer 131 may include an insulating material. For example, a photosensitive insulating material (PID) may be used as the insulating material, and in this case, a fine pitch may be realized through a photo via. The first insulating layer 131 may comprise a plurality of the first insulating layers 131. A boundary between the first insulating layers 131 may be identifiable or not.

The first redistribution layer 132 may redistribute the connection pad 120P of the second semiconductor chip 120 to be electrically connected to the vertical connection structure 110 and the second connection portion 170. The first redistribution layer 132 may include a metallic material such as copper (Cu), aluminum (Al), silver (Ag), tin (Sn), gold (Au), nickel (Ni), lead (Pb), titanium (Ti), or an alloy thereof. The first redistribution layer 132 may perform various functions according to the design of the semiconductor package 1000. For example, the first redistribution layer 132 may include a ground (GND) pattern, a power (PWR) pattern, a signal (S) pattern, and the like. The ground (GND) pattern and the power (PWR) pattern may be the same patterns. In addition, the first redistribution layer 132 may include a pad for the redistribution via, and a pad for the connection bump. The first redistribution layer 132 may be formed by a plating process, and may include a seed layer and a conductor layer.

The first redistribution via 133 may electrically connect first redistribution layers 132, formed on different layers to each other, and also electrically connect the connection pad 120P of the second semiconductor chip 120 and the vertical connection structure 110 to the redistribution layer 132. When the second semiconductor chip 120 is a bare die, the first redistribution via 133 may be in physically contact with the connection pad 120P. The first redistribution via 133 may include a metallic material, such as copper (Cu), aluminum (Al), silver (Ag), tin (Sn), gold (Au), nickel (Ni), lead (Pb), titanium (Ti), or alloys thereof. The first redistribution via 133 may include a signal via, a power via, a ground via, and the like, the power via and the ground via may be the same vias. The first redistribution via 133 may a filled-type via filled with a metal material, or a conformal-type via in which a metal material is formed along a wall surface of a via hole. The first redistribution via 133 may be formed by a plating process and may include a seed layer and a conductor layer. An upper surface of the first redistribution via 133 may be on (e.g., in contact with) a lower surface of the first pad 211. The first redistribution via 133 may have an upper width narrower than a lower width, and may have an inclined side surface, becoming narrower in a width thereof toward the first package 200. In this case, an etching process may be performed to form the first redistribution via 133 in the manufacturing process of the semiconductor package 1000, and the first redistribution via 133 may have the above-described shape by the etching process.

The second semiconductor chip 120 may be disposed below the first redistribution structure 130. An upper surface of the second semiconductor chip 120 may be in contact with a lower surface of the first redistribution structure 130. The second semiconductor chip 120 may be connected to the second redistribution structure 140 through a first connection portion 121 in a form of a ball or a post. The second semiconductor chip 120 may include silicon (Si), germanium (Ge), or gallium arsenide (GaAs), and various types of integrated circuits may be formed therein. The integrated circuit may be a processor chip such as a central processor (e.g., CPU), a graphics processor (e.g., GPU), a field programmable gate array (FPGA), an AP, a digital signal processor, a cryptographic processor, a microprocessor, a microcontroller, and the like, but an example embodiment is not limited thereto, and may be a logic chip such as an analog-digital converter, an application-specific IC (ASIC), or the like, or a memory chip such as a volatile memory (e.g., DRAM), a non-volatile memory (e.g., ROM and a flash memory), or the like.

The vertical connection structure 110 may be a conductive post disposed on a lower surface of the first redistribution structure 130 and penetrates through at least a portion of the third encapsulant 250 to electrically connect the second redistribution layer 142 and the first redistribution layer 132. The vertical connection structure 110 may include a plurality of vertical connection structures 110 disposed around the second semiconductor chip 120. The vertical connection structure 110 may form an electrical path penetrating through the third encapsulant 250. The vertical connection structure 110 may include a conductive material. The vertical connection structure 110 may be completely filled with a conductive material, and may have, for example, a cylindrical shape or a polygonal pole shape. The shape of the conductive post is not particularly limited and may have various shapes.

The first connection portion 121 may be disposed on the lower surface of the second semiconductor chip 120 and penetrate through at least a portion of the third encapsulant 250 to connect the second semiconductor chip 120 and the second redistribution structure 140. The first connection portion 121 may include, for example, a solder or a pillar, but may include both a pillar and a solder according to an example embodiment. The pillar may have a polygonal column shape such as a cylindrical column, or a square column or an octagonal column, and may include, for example, nickel (Ni), copper (Cu), palladium (Pd), platinum (Pt), gold (Au), or a combination thereof. The solder may have a spherical or ball shape, for example, may include tin (Sn), indium (In), bismuth (Bi), antimony (Sb), copper (Cu), silver (Ag), zinc (Zn), lead (Pb) and/or an alloy thereof. The alloy may include, for example, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, and the like.

The second redistribution structure 140 may include a second insulating layer 141, a second redistribution layer 142 disposed on the second insulating layer 141, and a second redistribution via 143 penetrating through the second insulating layer 141 to electrically connect the second redistribution layer 142 and the under bump metal 160 or the vertical connection structure 110. The second redistribution structure 140 may redistribute a connection pad 120P of the second semiconductor chip 120, and physically and/or electrically connect the connection pad 120P to external devices or systems through a second connection portion 170. The number of the second insulating layers 141, the second redistribution layers 142, and the second redistribution vias 143 may be more or fewer than those illustrated in the drawings.

The second insulating layer 141 may include an insulating material. For example, a PID may be used as the insulating material, and in this case, a fine pitch may be realized through a photo via. The second insulating layer 141 may comprise a plurality of the second insulating layers 141. A boundary between the second insulating layers 141 may be identifiable or not.

The second redistribution layer 142 may redistribute the connection pad 120P of the second semiconductor chip 120 to be electrically connected to the vertical connection structure 110 and the second connection portion 170. The second redistribution layer 142 may include a metallic material such as copper (Cu), aluminum (Al), silver (Ag), tin (Sn), gold (Au), nickel (Ni), lead (Pb), titanium (Ti), or an alloy thereof. The second redistribution layer 142 may perform various functions according to the design of the semiconductor package 1000. For example, the second redistribution layer 142 may include a ground (GND) pattern, a power (PWR) pattern, a signal (S) pattern, and the like. The ground (GND) pattern and the power (PWR) pattern may be the same patterns. In addition, the second redistribution layer 142 may include a pad for the redistribution via, and a pad for the connection bump. The second redistribution layer 142 may be formed by a plating process, and may include a seed layer and a conductor layer.

The second redistribution via 143 may electrically connect second redistribution layers 142, formed on different layers to each other, and also electrically connect the connection pad 120P of the second semiconductor chip 120 and the vertical connection structure 110 to the second redistribution layer 142. When the second semiconductor chip 120 is a bare die, the second redistribution via 143 may be in physically contact with the connection pad 120P. The second redistribution via 143 may include a metallic material such as copper (Cu), aluminum (Al), silver (Ag), tin (Sn), gold (Au), nickel (Ni), lead (Pb), titanium (Ti), or alloys thereof. The second redistribution via 143 may include a signal via, a power via, a ground via, and the like, the power via and the ground via may be the same vias. The second redistribution via 143 may be a filled-type via filled with a metal material, or a conformal-type via in which a metal material is formed along a wall surface of a via hole. The second redistribution via 143 may be formed by a plating process, and may include a seed layer and a conductor layer. The second redistribution via 143 may have an upper width narrower than a lower width, and may have an inclined side surface, becoming narrower in a width thereof toward the first package 200. In this case, an etching process may be performed to form the second redistribution via 143 in the manufacturing process of the semiconductor package 1000, and the second redistribution via 143 may have the above-described shape by the etching process.

The passivation layer 150 is configured to protect the second redistribution structure 140 from physical and chemical damage. The passivation layer 150 may include a thermosetting resin. For example, the passivation layer 150 may include ABF, but an example embodiment thereof is not limited thereto. The passivation layer 150 may have an opening for exposing at least a portion of a lowermost second redistribution layer 142 among the second redistribution layers 142. The number of openings may be tens to tens of thousands, and may have more or fewer openings. Each of the openings may be composed of a plurality of holes.

The under bump metal 160 may improve connection reliability of the second connection portion 170, and may improve board-level reliability of the semiconductor package 1000. The number of under bump metal 160 may be tens to tens of thousands, and the number thereof may be higher or lower. Each under bump metal 160 may be formed in an opening of the passivation layer 150 to be electrically connected to the exposed portion of lowermost second redistribution layer 142. The under bump metal 160 may be formed by a metallization method using metal, but an example embodiment thereof is not limited thereto.

The second connection portion 170 is configured to physically and/or electrically connect the semiconductor package 1000 to external devices or systems. For example, the semiconductor package 1000 may be mounted on a main board of the electronic device through the second connection portion 170. The second connection portion 170 may be disposed on the passivation layer 150 and may be electrically connected to the under bump metal 160, respectively. The second connection portion 170 may be formed of low-melting-point metal, for example, tin (Sn) or an alloy containing tin (Sn). The second connection portion 170 may include solder, but a material thereof is not particularly limited.

The second connection portion 170 may be a form of a land, a ball, a pin, or the like. The second connection portion 170 may be formed of multiple layers or a single layer. In the case of being formed in multiple layers, the second connection portion 170 may include a copper pillar and a solder. In the case of being formed in a single layer, the second connection portion 170 may include tin-silver solder or copper, but the present inventive concept is not limited thereto. The number, spacing, a dispositional type, and the like of the second connection portion 170 are not particularly limited, and may be sufficiently modified according to design specifications as understood by one of ordinary skill in the art.

At least a one of the second connection portion 170 may be disposed in a fan-out region. The fan-out region refers to a region outside the region in which the second semiconductor chip 120 is disposed. A fan-out package, including the fan-out region, is more reliable than a fan-in package, is capable of implementing multiple I/O terminals, and facilitates 3D interconnection. In addition, the fan-out package may have a thinner package thickness than a Ball Grid Array (BGA) package and a Land Grid Array (LGA) package, and be superior in price competitiveness.

Figure 4:
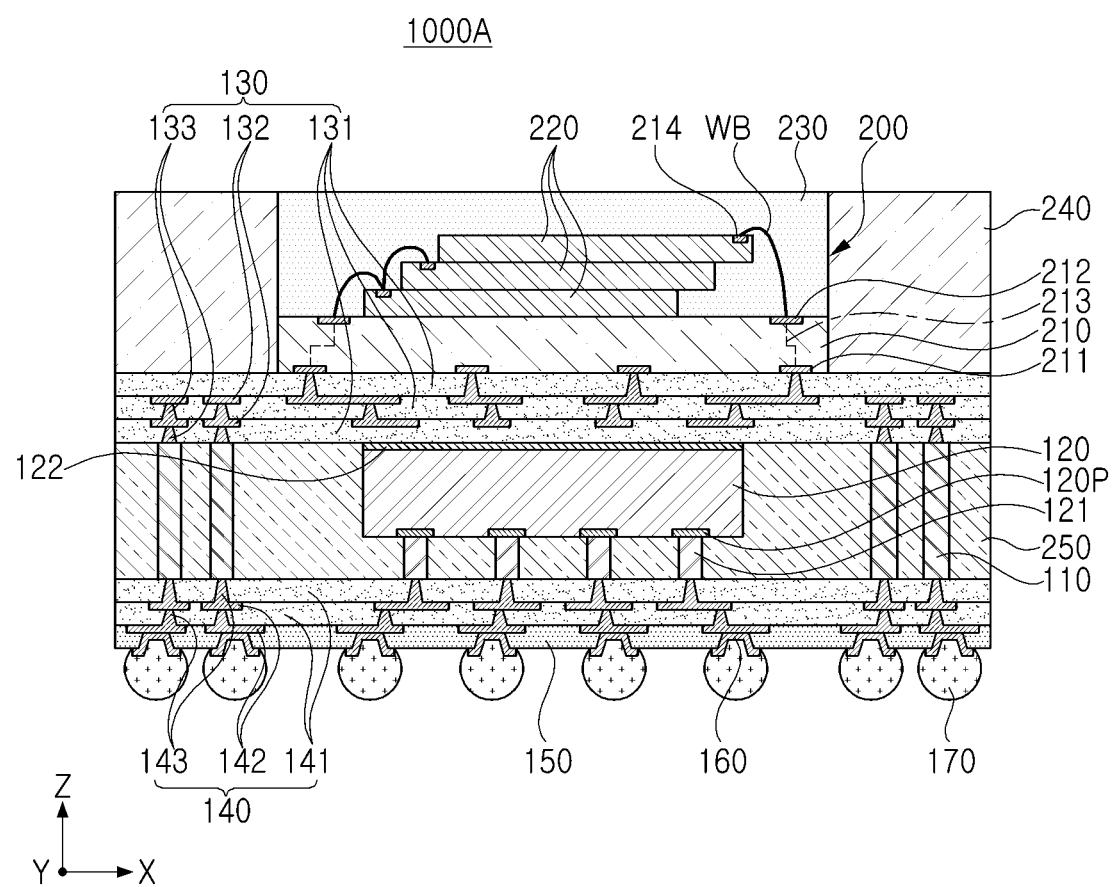
FIG. 4 is a cross-sectional view illustrating a semiconductor package according to an example embodiment of the present inventive concept.

FIG. 4 is a cross-sectional view illustrating a semiconductor package according to an example embodiment of the present inventive concept.

Referring to FIG. 4, an adhesive layer 122 disposed between the first redistribution structure 130 and the second semiconductor chip 120 may be further included. The adhesive layer 122 may fix the second semiconductor chip 120, and may include die attach film (DAF), non-conductive film (NCF), or non-conductive paste (NCP). The second semiconductor chip 120 may be mounted on the first redistribution structure 130 using the adhesive layer 122.

FIGS. 5 to 14 are cross-sectional views illustrating an exemplary process sequence in order to illustrate a manufacturing process of a semiconductor package according to an example embodiment of the present inventive concept.

The manufacturing process of the semiconductor package according to FIGS. 5 to 14 may be performed at a wafer level or a panel level in which a plurality of semiconductor packages (e.g., semiconductor package 1000) is simultaneously formed.

According to the manufacturing process of the semiconductor package (e.g., semiconductor package 1000) illustrated in FIGS. 5 to 14, a package on package may be manufactured without size fitting between a first package 200 and a second semiconductor chip 120. The second semiconductor chip 120 may be freely configured regardless of the size of the first package 200, and may increase the number of I/O terminals or increase the size of the second semiconductor chip 120 as necessary. In the manufacturing process of the semiconductor package 1000, by using the assembled first package 200, yield management may become easier and process simplification may be achieved. In the manufacturing process of the semiconductor package 1000, the process may be performed in a state in which front surfaces of the plurality of first packages 200 are attached to a carrier substrate 500. An upper package may be first formed, and a lower package may be formed later, so that the number of wafer support system (WSS) processes may be reduced.

Figure 5:
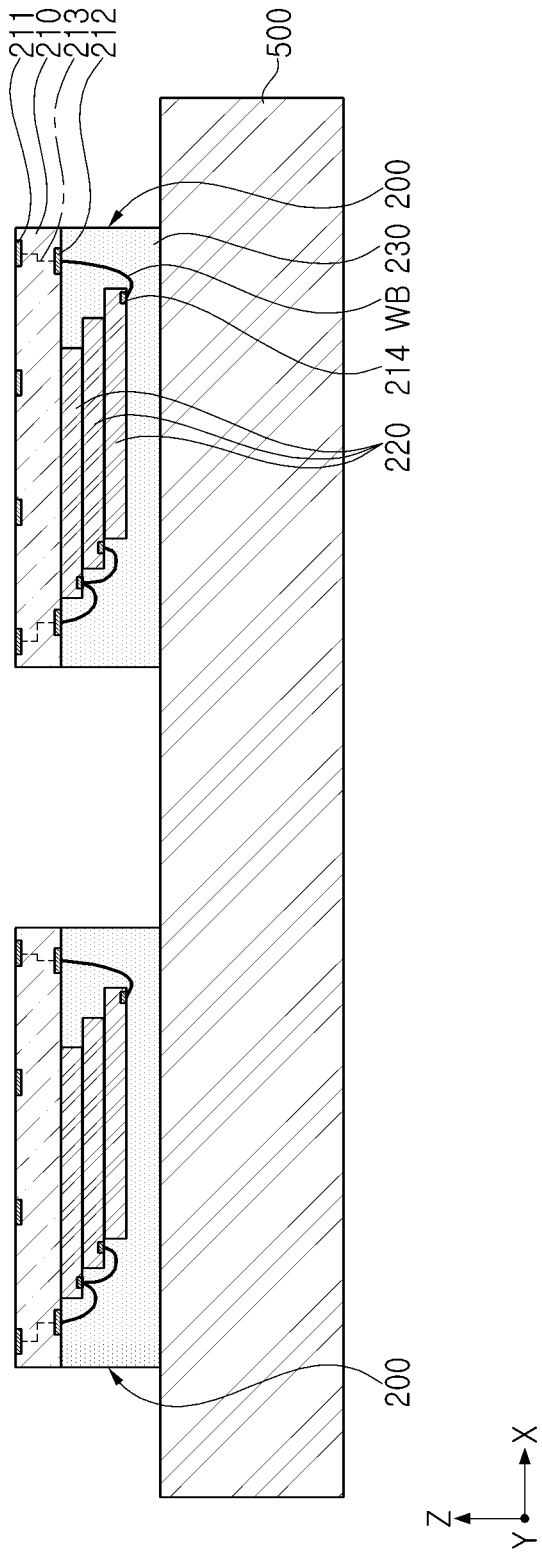
FIGS. 5 to 14 are cross-sectional views illustrating a process sequence in order to illustrate a manufacturing process of a semiconductor package according to an example embodiment of the present inventive concept.

Referring to FIG. 5, a first package 200 may include a first semiconductor chip 220, a package substrate 210 on which the first semiconductor chip 220 is mounted, a first pad 211 electrically connected to the first semiconductor chip 220, and a first encapsulant 230 on (e.g., encapsulating) a portion of the first semiconductor chip 220. The first package 200 may include a front surface in which the first encapsulant 230 is exposed, and a rear surface positioned opposite to the front surface. Next, the front surfaces of the plurality of first packages 200 are attached to the carrier substrate 500.

Figure 6:
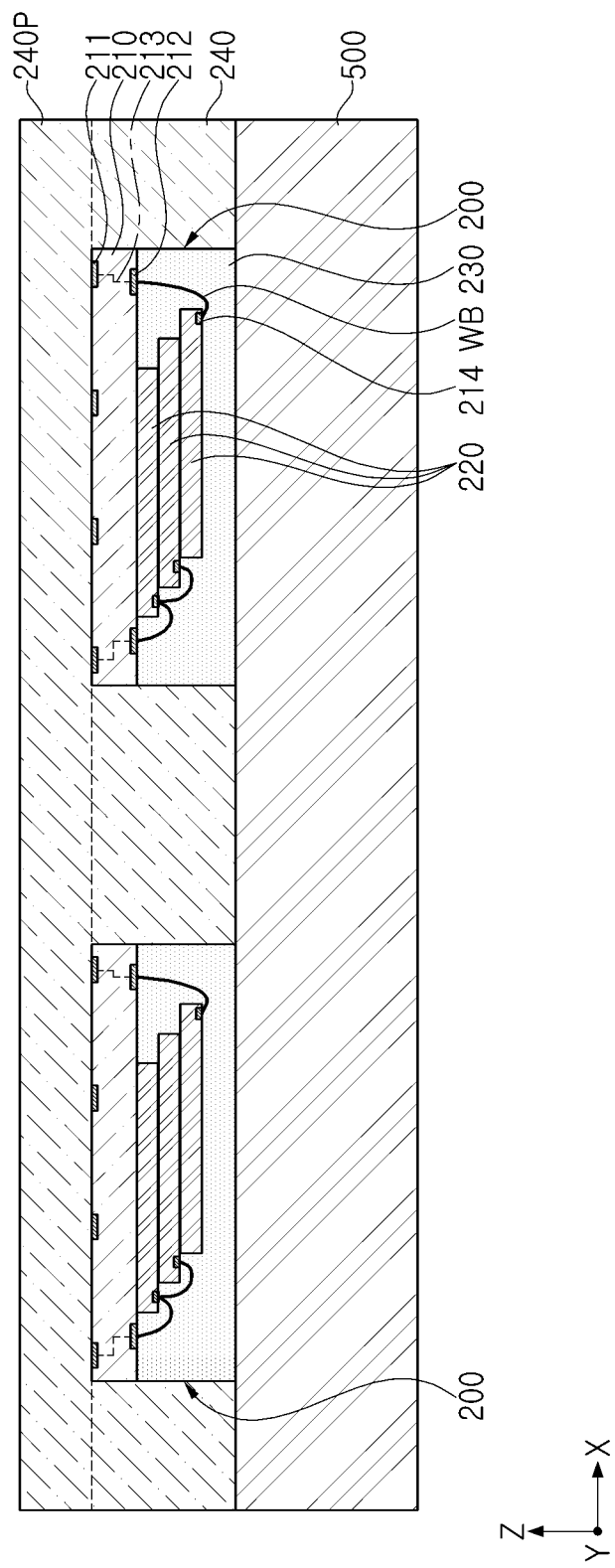

Referring to FIG. 6, a second encapsulant 240 may be formed on (e.g., encapsulating) a portion of the first package 200.

The second encapsulant 240, including a second preliminary encapsulant 240P, may be formed by laminating ABF and then curing the same. The second encapsulant 240 may be formed to cover the first package 200, and an upper surface thereof may be in a non-planarized state.

The second preliminary encapsulant 240P may be removed so that a first pad 211 of each of the first packages 200 is exposed. Accordingly, an upper surface of the second encapsulant 240 may be positioned on substantially the same level as an upper surface of the first package 200. The upper surface of the second encapsulant 240 may be coplanar with the upper surface of the first package 200.

Figure 7:
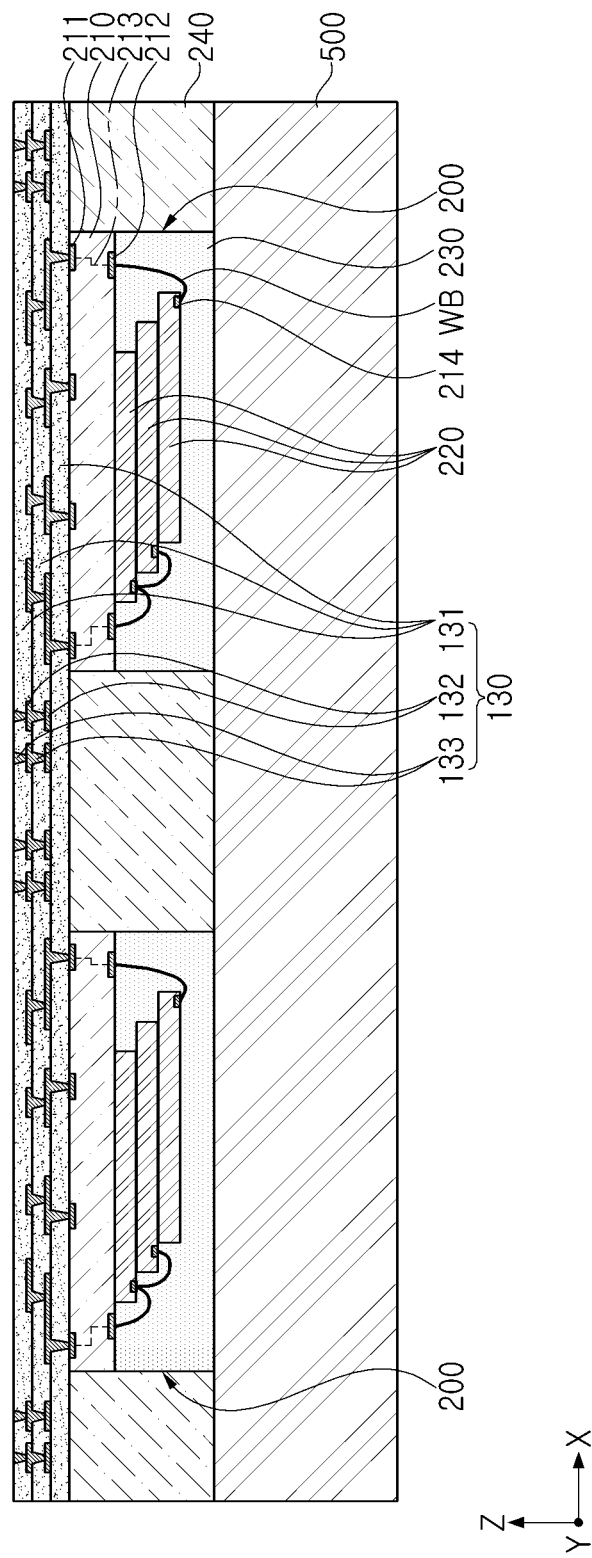

Referring to FIG. 7, a first redistribution structure 130 electrically connected to the first pad 211, and disposed on the first package 200 may be formed. The first redistribution structure 130 may include a first insulating layer 131, a first redistribution layer 132 disposed on the first insulating layer 131, and a first redistribution via 133 penetrating through the first insulating layer 131.

First, a first insulating layer 131 covering the first package 200 and the second encapsulant 240, and a via hole penetrating through the first insulating layer 131 may be formed. The first insulating layer 131 may be formed by coating and curing an insulating resin on the first insulating package 200 and the second encapsulant 240. The insulating resin may include a thermosetting resin such as an epoxy resin, a thermoplastic resin such as polyimide, or a resin impregnated with an inorganic filler and/or glass fiber (Glass Fiber, Glass Cloth, Glass Fabric) in these resins, for example, a prepreg, Ajinomoto Build-up Film (ABF), FR-4, and Bismaleimide Triazine (BT). Since the first insulating layer 131 may serve to protect the first redistribution layers 132, it may include a material having excellent physical properties such as durability and heat resistance. For example, the first insulating layer 131 may be formed using ABF. A via hole, in which a first redistribution via 133 is to be formed through a subsequent process, may be formed in the first insulating layer 131 by a photolithography process and/or an etching process. Here, the photolithography process may include a series of processes including an exposure process, a developing process, and a cleaning process.

Next, a first redistribution via 133 penetrating through the first insulating layer 131 may be formed in the via hole. The first redistribution layer 132 and the first redistribution via 133 may be formed by performing a plating process. For example, after coating a photoresist (not illustrated) on the first insulating layer 131, the photoresist may be patterned using a photolithography process. The patterned photoresist (not illustrated) may expose via holes. Before coating the photoresist (not illustrated), a seed layer (not illustrated) may be formed on an inner wall of the via holes. A plating process may be performed using the patterned photoresist (not illustrated) and the seed layer (not illustrated). The first redistribution layer 132 and the first redistribution via 133 may include a metal material such as copper (Cu) or an alloy including the same.

Through the same process as described above, one layer of the first insulating layer 131, the first redistribution layer 132, and the first redistribution via 133 were formed. By repeating the above-described process, a plurality of first insulating layers 131, first redistribution layers 132, and first redistribution vias 133 may be formed.

Figure 8:
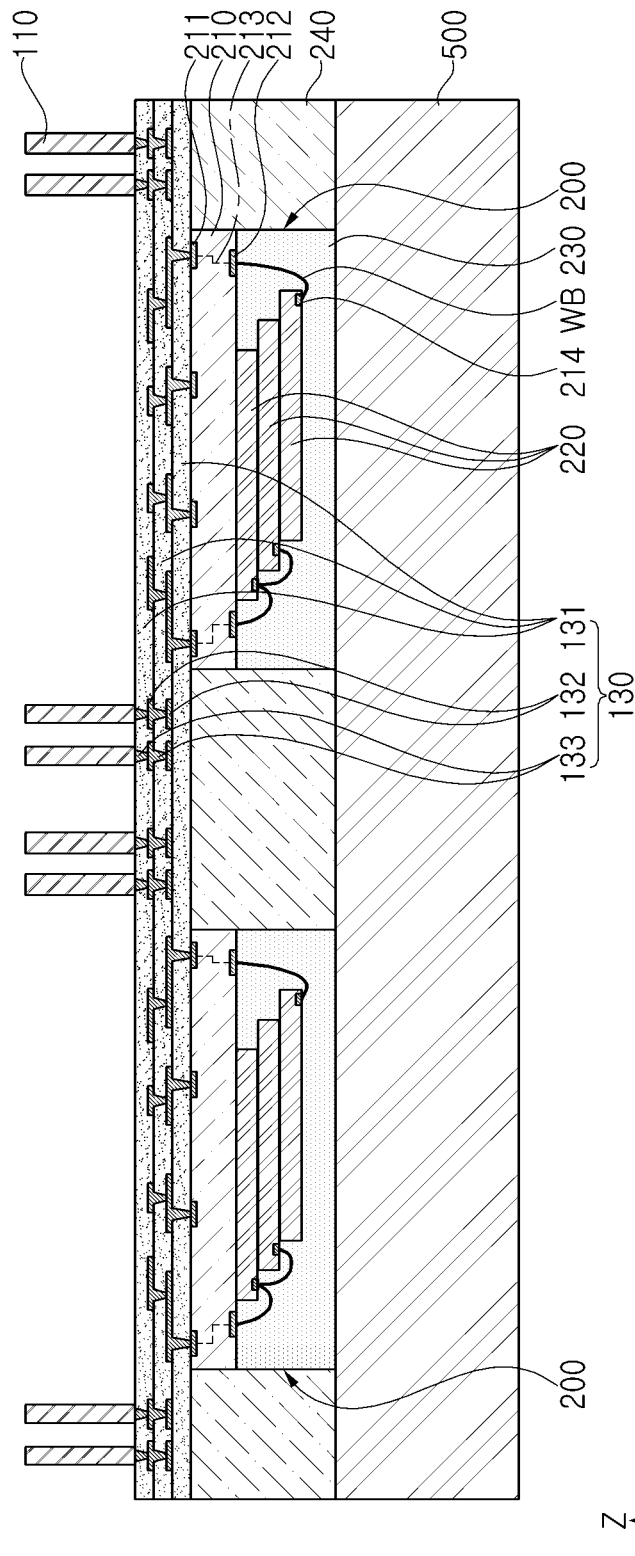

Referring to FIG. 8, a vertical connection structure 110 disposed on the first redistribution structure 130 may be formed.

First, a photoresist pattern may be formed on an upper surface of the first redistribution structure 130. The photoresist pattern may include an opening for exposing a portion of the first redistribution via 133 of the first redistribution structure 130. The opening of the photoresist pattern may define a region in which the vertical connection structure 110 is to be formed through a subsequent process. A vertical connection structure 110 may be formed in the opening of the photoresist pattern. The vertical connection structure 110 may be formed on a portion of the first redistribution via 133 of the first redistribution structure 130 exposed through the opening of the photoresist pattern, and may be formed to fill at least a portion of the opening of the photoresist pattern. The vertical connection structure 110 may be formed of copper (Cu), but an example embodiment thereof is not limited thereto.

A planarization process may be performed on the photoresist pattern and the vertical connection structure 110 until a planarized surface is obtained on an upper surface of the photoresist pattern and an upper surface of the vertical connection structure 110. For example, in order to obtain a planarized surface, etch-back, chemical mechanical polishing (CMP), or the like, may be performed. By the planarization process, the upper surface of the photoresist pattern may be on the same plane as the upper surface of the vertical connection structure 110. In example embodiments, when planarizing the photoresist pattern and the vertical connection structure 110 through the CMP process, CMP process conditions, for example, pressure and a rotational speed of a polishing head, a type of slurry, and the like, may be adjusted so that the planarized surface of the vertical connection structure 110 is smoothened.

Next, the photoresist pattern is removed. For example, the photoresist pattern may be removed by a strip process.

Figure 9:
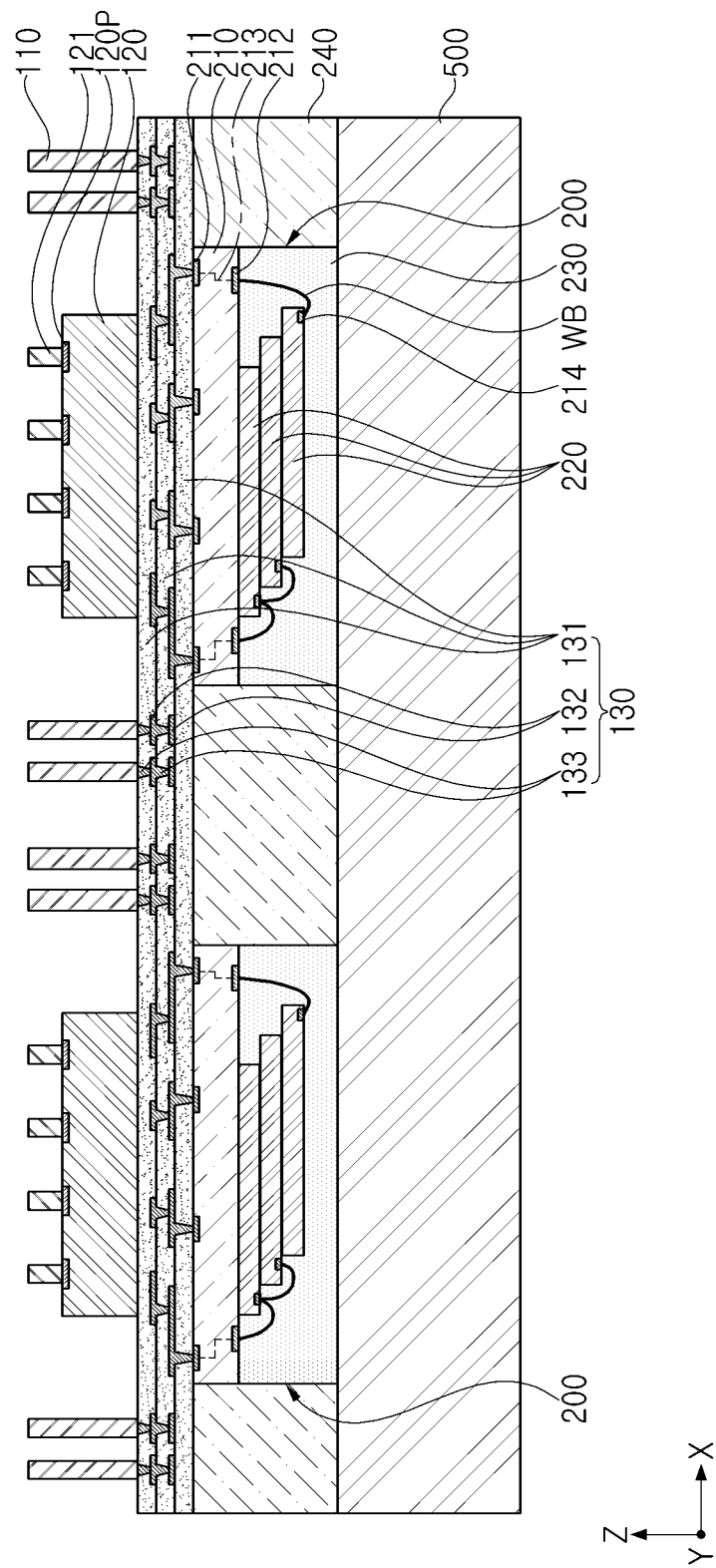

Referring to FIG. 9, a second semiconductor chip 120, electrically connected to the first package 200 through the first and second redistribution structures 130 and 140 (The second redistribution structure may be formed through subsequent processes.) and the vertical connection structure 110, may be formed on the first redistribution structures 130. The second semiconductor chip 120 may include a connection pad 120P, and a first connection portion 121 connected to the connection pad 120P may be formed on the connection pad 120P.

First, a second semiconductor chip 120 may be mounted on the first redistribution structure 130. When the second semiconductor chip 120 is mounted on the first redistribution structure 130, an adhesive layer may be formed between the second semiconductor chip 120 and the first redistribution structure 130. The adhesive layer may fix the second semiconductor chip 120, and may include DAF, NCF, or NCP.

Next, a first connection portion 121 may be formed on the connection pad 120P of the second semiconductor chip 120. The first connection portion 121 may include, for example, a solder or a pillar, but may include both a pillar and a solder according to example embodiments.

According to another example embodiment, the second semiconductor chip 120 may be mounted on the first redistribution structure 130 after the formation of the first connection portion 121.

Figure 10:
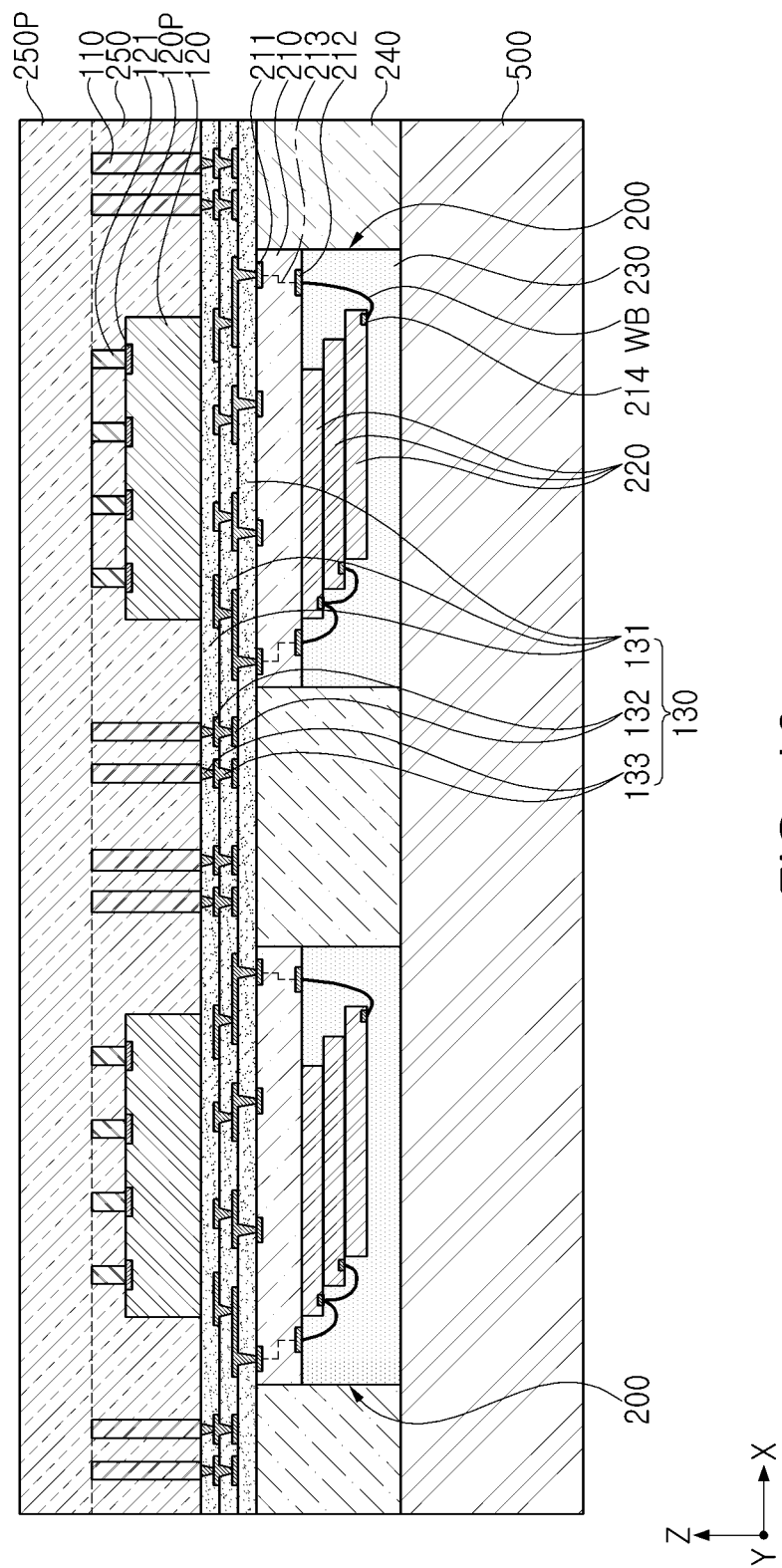

Referring to FIG. 10, a third encapsulant 250 on (e.g., encapsulating) a portion of each of the vertical connection structure 110, the second semiconductor chip 120, and the first connection portion 121 may be formed.

The third encapsulant 250, including a third preliminary encapsulant 250P, may be formed by laminating ABF and then curing the same. The third encapsulant 250 may be formed to cover the vertical connection structure 110, the second semiconductor chip 120, and the first connection portion 121, and an upper surface thereof may be in a pre-planarized state.

Next, the third preliminary encapsulant 250P may be removed so that the vertical connection structure 110, the second semiconductor chip 120, and the first connection part 121 may be exposed. Accordingly, an upper surface of the third encapsulant 250 may be positioned on substantially the same level as upper surfaces of the vertical connection structure 110 and the first connecting portion 121, and the upper surface of the third encapsulant 250 may form a coplanar surface with the upper surfaces of the vertical connection structure 110 and the first connection portion 121.

Figure 11:
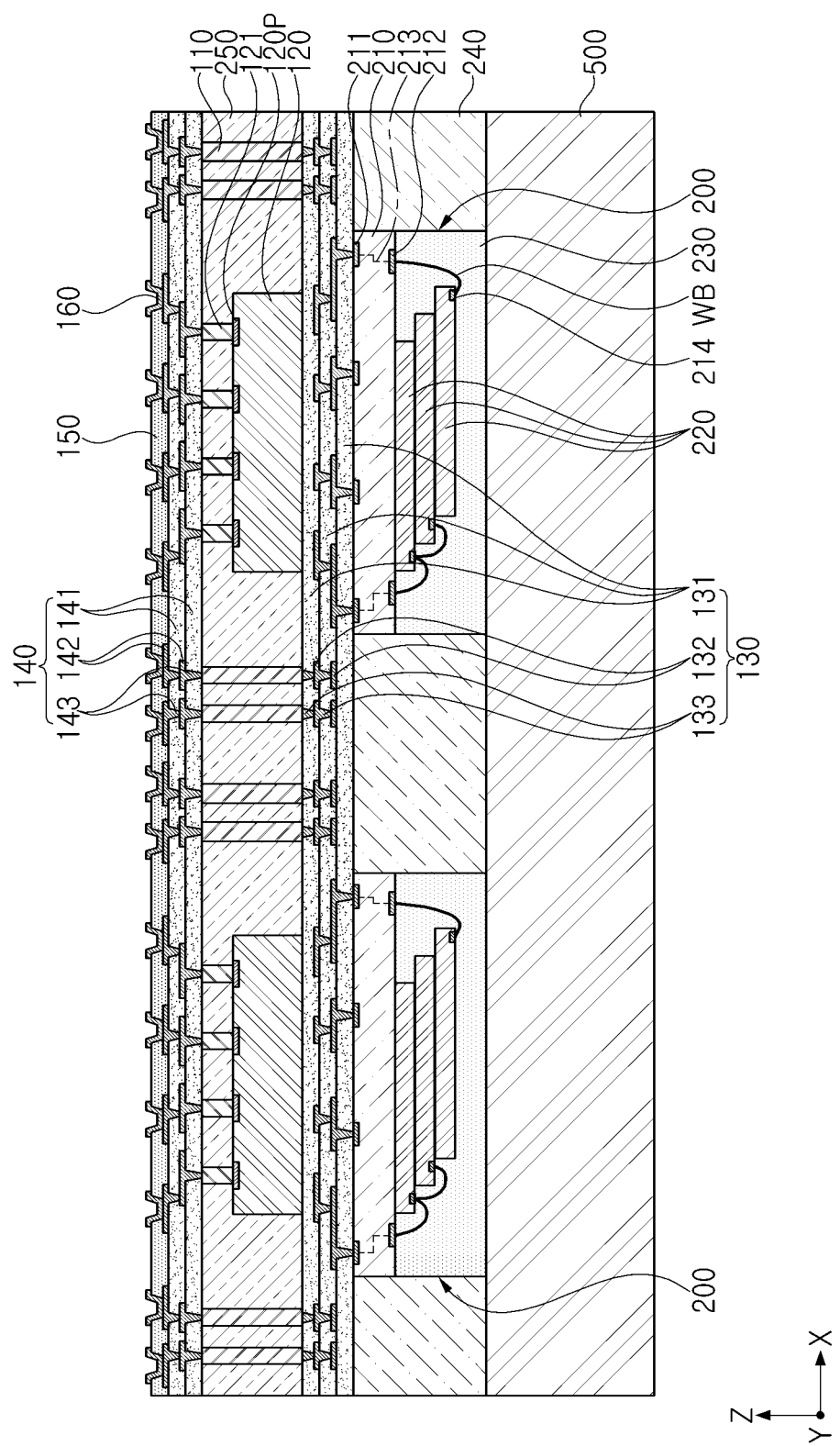

Referring to FIG. 11, a second redistribution structure 140 electrically connected to the first redistribution structure 130 and disposed on the first redistribution structure 130, a passivation layer 150 disposed on the second redistribution structure 140, and under bump metal 160 may be formed.

The second redistribution structure 140 may include a second insulating layer 141, a second redistribution layer 142 disposed on the second insulating layer 141, and a second redistribution via 143 penetrating through the second insulating layer 141.

First, a second insulating layer 141 on (e.g., covering) the vertical connection structure 110, the first connection portion 121, and the third encapsulant 250, and a via hole, in which the second redistribution via 143 is to be formed through a subsequent process, penetrating through the second insulating layer 141 may be formed. The second insulating layer 141 may be formed by coating and curing an insulating resin on the vertical connection structure 110, the first connection portion 121, and the third encapsulant 250. The insulating resin may include a thermosetting resin such as an epoxy resin, a thermoplastic resin such as polyimide, or a resin impregnated with an inorganic filler and/or glass fiber (Glass Fiber, Glass Cloth, Glass Fabric) in these resins, for example, a prepreg, ABF, FR-4, and BT. Since the second insulating layer 141 may serve to protect the second redistribution layers 141, it may include a material having excellent physical properties such as durability and heat resistance. For example, the second insulating layer 141 may be formed using ABF. The via hole may be formed by a photolithography process and/or an etching process. Here, the photolithography process may include a series of processes including an exposure process, a developing process, and a cleaning process.

Next, a second redistribution via 143 penetrating through the second insulating layer 141 may be formed. The second redistribution layer 142 and the second redistribution via 143 may be formed by performing a plating process. For example, after coating a photoresist (not illustrated) on the second insulating layer 141, the photoresist may be patterned using a photolithography process. The patterned photoresist (not illustrated) may expose the via holes. Before coating the photoresist (not illustrated), a seed layer (not illustrated) may be formed on an inner wall of the via holes. A plating process may be performed using the patterned photoresist (not illustrated) and the seed layer (not illustrated). Accordingly, the second redistribution layer 142 and the second redistribution via 143 may include a metal material such as copper (Cu) or an alloy including the same.

Through the same process as described above, one layer of the second insulating layer 141, the second redistribution layer 142, and the second redistribution via 143 were formed. By repeating the above-described process, a plurality of second insulating layers 141, second redistribution layers 142, and second redistribution vias 143 may be formed.

Next, a passivation layer 150 may be formed. The passivation layer 150 may be formed by chemical vapor deposition (CVD), atomic layer deposition (ALD), or physical vapor deposition (PVD). Although not illustrated, the passivation layer 150 may be formed of a plurality of layers. For example, the passivation layer 150 may include a first passivation layer formed of a silicon oxide film, a second passivation layer disposed on the first passivation layer and formed of a silicon nitride film, and a third passivation layer disposed on the second passivation layer and formed of a silicon oxide film.

Next, under bump metal 160 may be formed. After exposing a portion of the upper second redistribution layer 142, the under bump metal 160 may be formed on the exposed second redistribution layer 142.

Figure 12:
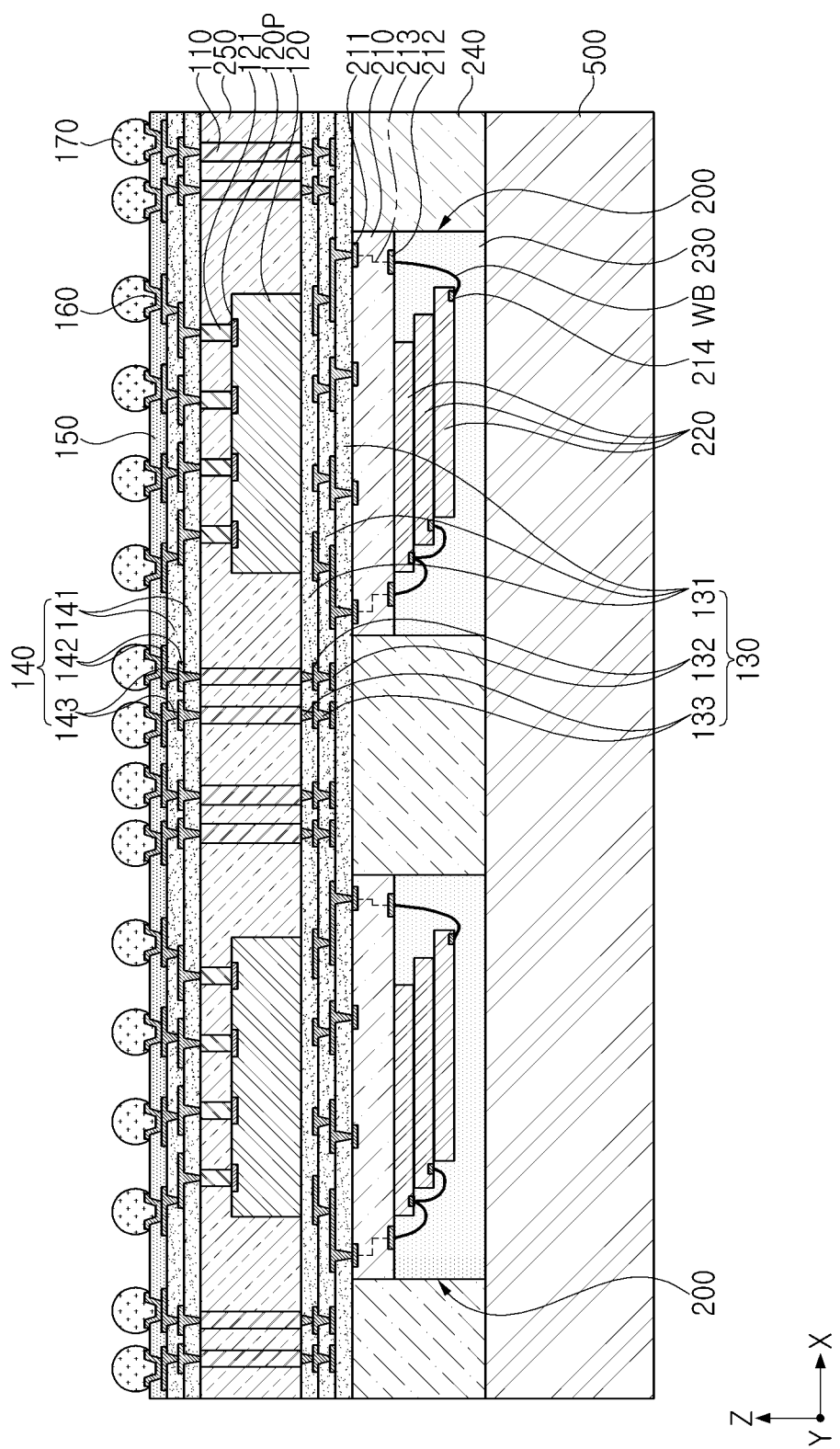

Referring to FIG. 12, a second connection portion 170 connected to the second redistribution structure 140 may be formed. The second connection portion 170 may be formed by various methods, for example, by disposing and reflowing a conductor such as a solder ball, or forming and plating a seed layer.

Figure 13:
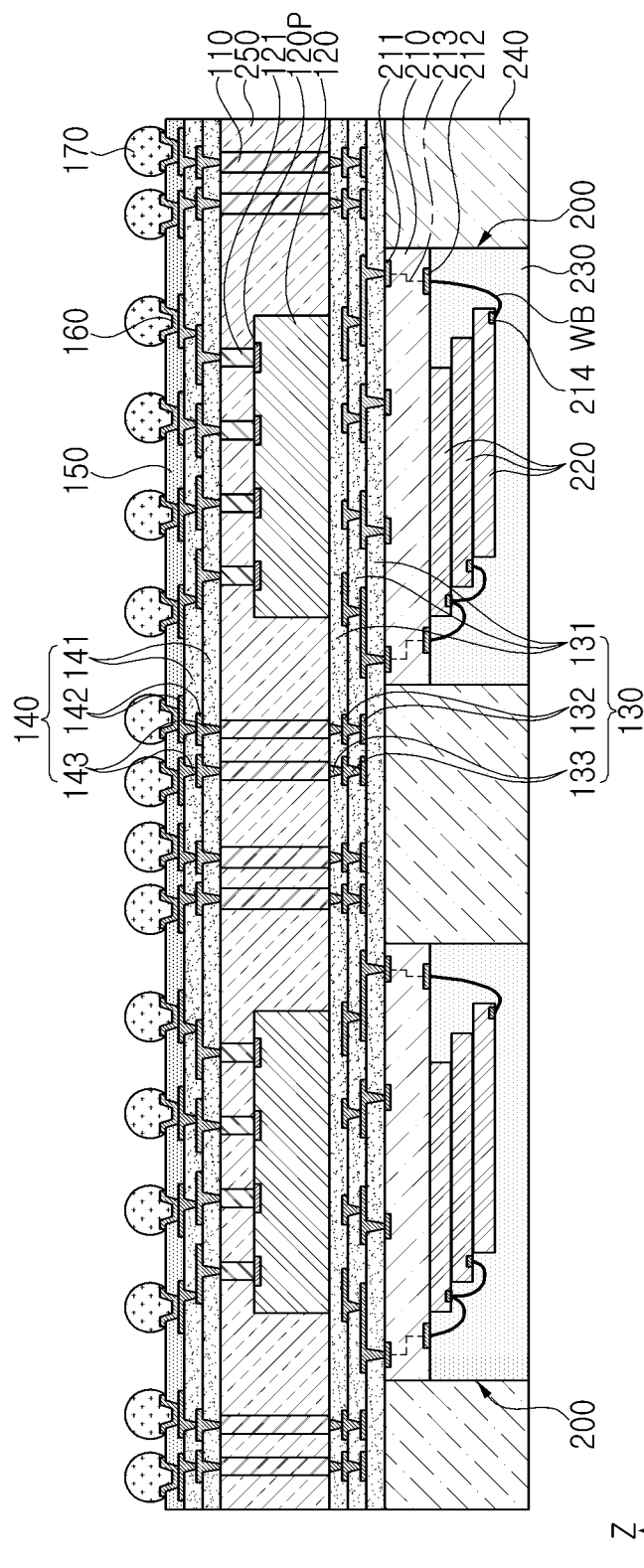

Referring to FIG. 13, a second package, which is to be the semiconductor package 1000 through a subsequent process, including the second semiconductor chip 120, the first and second redistribution structures 130 and 140, the vertical connection structure 110, the first and second connection portions 121 and 170, and the second and third encapsulants 240 and 250 is detached from the carrier substrate 500. In order to separate the carrier substrate 500 therefrom, a laser may be irradiated or heat may be applied to a resultant of FIG. 12. Thereby, a formation of the second package may be completed.

Figure 14:
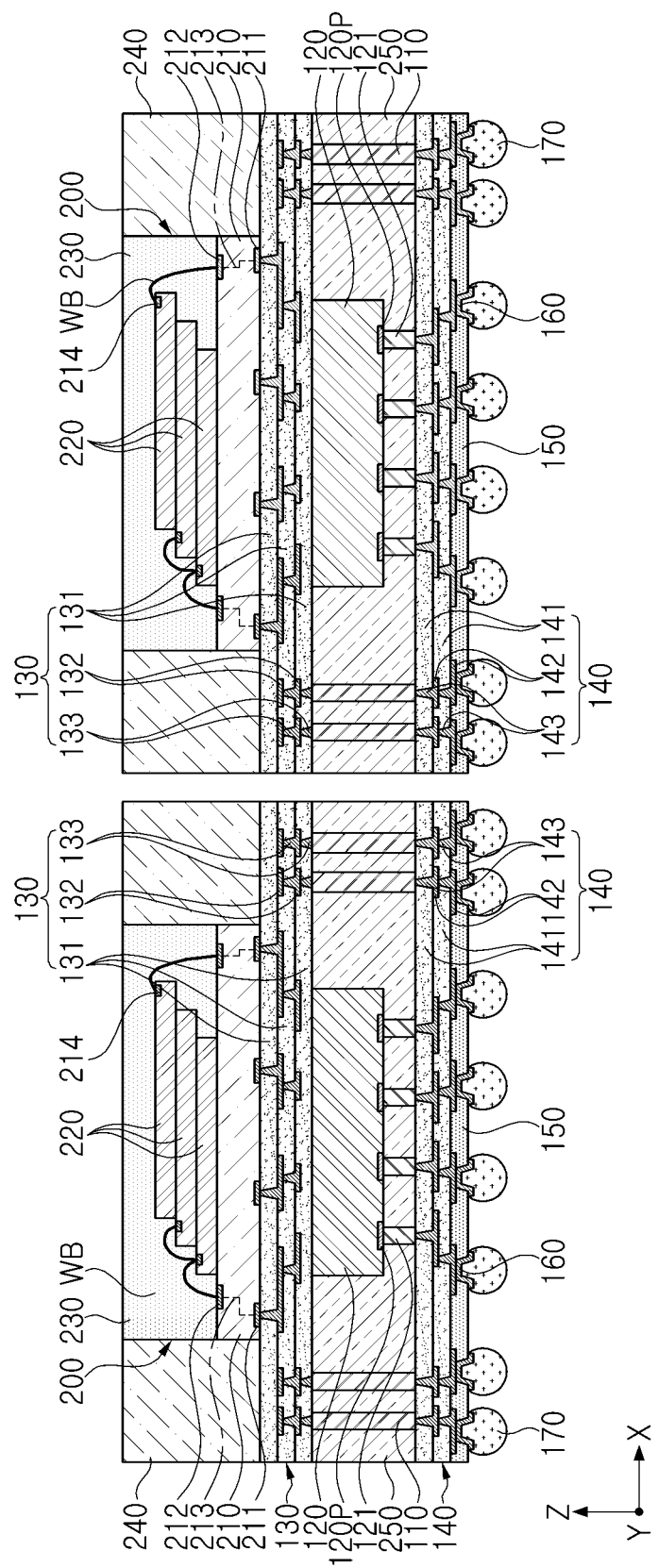

Referring to FIG. 14, the second package may be individualized through a singulation process of cutting the second package, a resultant of FIG. 13.

Accordingly, the semiconductor package 1000 of FIGS. 1 to 3 may be finally manufactured.

As set forth above, according to example embodiments of the present inventive concept, a semiconductor package having improved mass productivity may be provided through a method for manufacturing the semiconductor package performed in a state in which a front surface of a first package is attached to a carrier substrate.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an intermediate layer (e.g., adhesive layer) as well as a direct connection between two components with or without intervening layers or components. In addition, "electrically connected" conceptually includes a physical connection and a physical disconnection. It can be understood that when an element is referred to with terms such as "first" and "second", the element is not limited thereby. They may be used only for a purpose of distinguishing an element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A semiconductor package, comprising:
a first redistribution structure including a first redistribution via;
a first package that is on an upper surface of the first redistribution structure and comprises:
a package substrate including a first pad;
a first semiconductor chip on the package substrate; and
a first encapsulant on the first semiconductor chip;
a second encapsulant on the first package;
a second redistribution structure that is on a lower surface of the first redistribution structure and comprises a second redistribution via;
a second semiconductor chip that is between the first redistribution structure and the second redistribution structure and comprises a connection pad;
a vertical connection structure that is between the first redistribution structure and the second redistribution structure; and
a third encapsulant on the second semiconductor chip and the vertical connection structure,
wherein the vertical connection structure is electrically connected to the first redistribution via and the second redistribution via,
wherein the connection pad is electrically connected to the second redistribution via,
wherein the first redistribution via is electrically connected to the first pad, and
wherein an upper surface of the first encapsulant is exposed from the second encapsulant.

2. The semiconductor package of claim 1, wherein the first redistribution via is in contact with the first pad.

3. The semiconductor package of claim 1, wherein the second encapsulant is in contact with the first encapsulant and the first redistribution structure.

4. The semiconductor package of claim 1, wherein a lower surface of the first package is in contact with the upper surface of the first redistribution structure.

5. The semiconductor package of claim 1, wherein the semiconductor package further comprises an adhesive layer disposed between the first redistribution structure and the second semiconductor chip.

6. A semiconductor package, comprising:
a first package including a first semiconductor chip, a package substrate including a first pad electrically connected to the first semiconductor chip and on which the first semiconductor chip is mounted, and a first encapsulant on a portion of the first semiconductor chip;
a second encapsulant on a portion of the first package;
a first redistribution structure including a first redistribution via connected to the first pad, and disposed on a lower surface of the first package;
a second semiconductor chip disposed on a lower surface of the first redistribution structure, the second semiconductor chip having an upper surface facing the first redistribution structure and a lower surface on which a connection pad is disposed; and
a second redistribution structure including a second redistribution via electrically connected to the connection pad of the second semiconductor chip, and disposed on the lower surface of the second semiconductor chip,
wherein the first and second redistribution vias have respective inclined side surfaces and become narrower in width toward the first package.

7. The semiconductor package of claim 6, wherein an upper width of the first redistribution via is narrower than a lower width of the first redistribution via and an upper width of the second redistribution via is narrower than a lower width of the second redistribution via.

8. The semiconductor package of claim 6, wherein an upper surface of the first redistribution via is in contact with a lower surface of the first pad.

9. The semiconductor package of claim 6, wherein the first redistribution structure further comprises a first redistribution layer connected to the first redistribution via and a first insulating layer surrounding the first redistribution layer and the first redistribution via.

10. The semiconductor package of claim 9, wherein the second redistribution structure further comprises a second redistribution layer connected to the second redistribution via and a second insulating layer surrounding the second redistribution layer and the second redistribution via.

11. The semiconductor package of claim 10, wherein the second redistribution structure further comprises a passivation layer disposed on a lower surface of the second insulating layer.

12. The semiconductor package of claim 11, wherein the first and second insulating layers comprise a photosensitive insulating material (PID).

13. A method for manufacturing a semiconductor package, comprising:
providing a first package including a first semiconductor chip, a package substrate including a first pad electrically connected to the first semiconductor chip and on which the first semiconductor chip is mounted, and a first encapsulant on the first semiconductor chip, wherein a front surface of the first package comprises the first encapsulant and a rear surface of the first package is positioned opposite to the front surface;
attaching the front surface of the first package to a carrier substrate;
forming a second encapsulant on the first package;
forming a first redistribution structure including a first redistribution via connected to the first pad on the first package and the second encapsulant;
forming a vertical connection structure connected to the first redistribution via on the first redistribution structure;
mounting a second semiconductor chip on the first redistribution structure, wherein the second semiconductor chip includes a connection pad on an upper surface of the second semiconductor chip;
forming a third encapsulant on the vertical connection structure and the second semiconductor chip;
forming a second redistribution structure on the third encapsulant, wherein the second redistribution structure includes a second redistribution via connected to the vertical connection structure and the connection pad; and
forming a connection portion on the second redistribution structure.

14. The method for manufacturing a semiconductor package of claim 13, further comprising removing the carrier substrate.

15. The method for manufacturing a semiconductor package of claim 14, further comprising singulating the semiconductor package.

16. The method for manufacturing a semiconductor package of claim 13, wherein forming the second encapsulant comprises forming an second preliminary encapsulant and removing a portion of the second preliminary encapsulant to expose the first pad from the second encapsulant.

17. The method for manufacturing a semiconductor package of claim 16, wherein an upper surface of the first pad and an upper surface of the second encapsulant are substantially coplanar.

18. The method for manufacturing a semiconductor package of claim 13, wherein forming the third encapsulant comprises forming a third preliminary encapsulant and removing a portion of the third preliminary encapsulant to expose the vertical connection structure from the third encapsulant.

19. The method for manufacturing a semiconductor package of claim 18, wherein an upper surface of the vertical connection structure and an upper surface of the third encapsulant are substantially coplanar.

20. The method for manufacturing a semiconductor package of claim 13, wherein an adhesive layer is interposed between the first redistribution structure and the second semiconductor chip.

\* \* \* \* \*